(12) United States Patent
Shin et al.

(10) Patent No.: US 11,835,865 B2
(45) Date of Patent: Dec. 5, 2023

(54) OVERLAY MEASUREMENT APPARATUS

(71) Applicant: AUROS TECHNOLOGY, INC., Hwaseong-si (KR)

(72) Inventors: Hyeon Gi Shin, Hwaseong-si (KR); Bo Kyung Ryu, Hwaseong-si (KR); Jung Sun Ko, Hwaseong-si (KR); Jin Woo Park, Seongnam-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/314,868

(22) Filed: May 10, 2023

(65) Prior Publication Data

US 2023/0324811 A1    Oct. 12, 2023

Related U.S. Application Data

(63) Continuation of application No. PCT/KR2022/016028, filed on Oct. 20, 2022.

(30) Foreign Application Priority Data

Mar. 28, 2022  (KR) ........................ 10-2022-0037874

(51) Int. Cl.
  *G03F 7/00*       (2006.01)
(52) U.S. Cl.
  CPC ...... *G03F 7/70633* (2013.01); *G03F 7/70641* (2013.01); *G03F 7/706849* (2023.05); *G03F 7/706851* (2023.05); *G03F 7/7085* (2013.01)
(58) Field of Classification Search
  CPC ............. G03F 7/70605; G03F 7/70616; G03F 7/70625; G03F 7/70633; G03F 7/70641; G03F 7/7065; G03F 7/70653; G03F 7/70681; G03F 7/706843; G03F 7/706845; G03F 7/706849; G03F 7/706851
  See application file for complete search history.

(56) References Cited

U.S. PATENT DOCUMENTS

| | | | |
|---|---|---|---|
| 7,894,062 B2* | 2/2011 | Choi ................... | G03F 7/70633 356/625 |
| 10,663,281 B2* | 5/2020 | Manassen ............ | G01B 11/272 |
| 10,677,588 B2* | 6/2020 | Hill ..................... | G03F 7/70633 |

(Continued)

FOREIGN PATENT DOCUMENTS

| | | | | |
|---|---|---|---|---|
| JP | 2001351842 A | * | 12/2001 | ......... G03F 7/70616 |
| JP | 2002196223 A | * | 7/2002 | ......... G03F 7/70633 |

(Continued)

*Primary Examiner* — Gordon J Stock, Jr.
(74) *Attorney, Agent, or Firm* — NKL LAW; Jae Youn Kim

(57) ABSTRACT

An overlay measurement apparatus that can quickly measure an overlay error between layers with a large height difference is provided. The overlay measurement apparatus measures an error between a first overlay mark and a second overlay mark formed in a pair on different layers of a wafer. The overlay measurement apparatus includes an imaging system configured to acquire alignment images of a pair of first and second overlay marks at a plurality of focus positions, and a controller communicatively coupled to the imaging system. The overlay measurement apparatus can rapidly and accurately measure an overlay error between layers with a large height difference.

14 Claims, 11 Drawing Sheets

(56) References Cited

U.S. PATENT DOCUMENTS

| | | | |
|---|---|---|---|
| 10,724,961 B2* | 7/2020 | Shmarev | G01N 21/8806 |
| 11,592,755 B2* | 2/2023 | Manassen | G03F 7/70633 |
| 2016/0282730 A1* | 9/2016 | Sasaki | H01L 22/12 |
| 2022/0035258 A1* | 2/2022 | Lee | G03F 7/20 |
| 2022/0326008 A1* | 10/2022 | Park | G03F 7/70633 |
| 2023/0184546 A1* | 6/2023 | Lee | H01L 21/681 |
| | | | 356/138 |

FOREIGN PATENT DOCUMENTS

| | | |
|---|---|---|
| KR | 10-2000-0066320 A | 11/2000 |
| KR | 10-2003-0054781 A | 7/2003 |
| KR | 10-0689709 B1 | 3/2007 |
| KR | 10-1564312 B1 | 10/2015 |
| KR | 10-2020-0000474 A | 1/2020 |
| KR | 10-2020-0031744 A | 3/2020 |
| KR | 10-2021-0031015 A | 3/2021 |
| KR | 10-2022-0016950 A | 2/2022 |
| WO | 2021049845 A2 | 3/2021 |

* cited by examiner

OVERLAY MEASUREMENT APPARATUS

CROSS REFERENCE TO RELATED APPLICATION

The present application claims priority to Korean Patent Application No. 10-2022-0037874, filed Mar. 28, 2022, the entire contents of which is incorporated herein for all purposes by this reference.

BACKGROUND OF THE INVENTION

Field of the Invention

The present disclosure relates to an overlay measurement apparatus and, more particularly, to an overlay measurement apparatus that can quickly measure an overlay error between layers with a large height difference.

Description of the Related Art

As technology advances, the size of a semiconductor device is reduced, and an increase in the density of integrated circuits is required. In order to meet such a requirement, various conditions must be satisfied. Among these conditions, an overlay tolerance is one of the important indicators.

Semiconductor devices are manufactured through numerous manufacturing processes. In order to form an integrated circuit on a wafer, it is necessary to go through a number of manufacturing processes so that desired circuit structures and elements are sequentially formed at specific locations. The manufacturing processes allow the sequential creation of patterned layers on the wafer. Electrically activated patterns are created in the integrated circuit through these repeated lamination processes. At this time, if the respective structures are not aligned within a tolerance range permitted in the manufacturing processes, interference may occur between the electrically activated patterns, and this phenomenon may cause problems in the performance and reliability of the manufactured circuit. An overlay measurement tool is used to measure and verify alignment errors between the laminated layers.

Typical overlay measurement methods measure and verify whether the alignment between two layers falls within a tolerance. One of the overlay measurement methods is a method in which an overlay is measured by forming structures called overlay marks at specific positions on a substrate and imaging the structures with an optical image acquisition device. The structures for measurement are designed to make it possible to measure an overlay in at least one of the X and Y directions for each layer. The respective structures are designed as symmetrical structures. The center value between the structures arranged in a symmetrical direction is calculated and used as a representative value of the corresponding layer, and an overlay error is derived by calculating the relative difference between the representative values of the respective layers.

Hereinafter, a method of measuring an overlay of two layers using a box-in-box (BIB) overlay mark will be briefly described. First, as shown in FIGS. 1 and 2, a first overlay mark OM1 having a substantially box shape and a second overlay mark OM2 having a box shape smaller than the first overlay mark OM1 are formed on two consecutive layers, respectively. Then, images of the first overlay mark OM1 and the second overlay mark OM2 are acquired at once. Next, as shown in FIG. 3, a center value C1 of the first overlay mark OM1 and a center value C2 of the second overlay mark OM2 are respectively obtained by acquiring a waveform representing changes in intensity by position. Then, an overlay error between the two layers is measured by comparing these center values.

When the height difference between the two layers is not large, a combined image of the first overlay mark OM1 and the second overlay mark OM2 may be acquired at once after automatically focusing using an autofocus sensor. Although the focus obtained using the autofocus sensor may not be the optimal focus for acquiring the combined image, it is not a big problem when the height difference between the two layers is not large.

In recent years, however, due to the development of semiconductor process technology, there is a need to accurately and rapidly measure an overlay error between layers with a large height difference and different optical properties. Yet, the difference between "standard focus" obtained using an autofocus sensor and "measure focus" for more accurate measurement may be large, which is problematic. For example, while the standard focus obtained by the autofocus sensor is on top of a current layer, the measure focus may be between a previous layer and the current layer. In this case, if the image obtained using the autofocus sensor to provide the standard focus is used, the overlay error may not be accurately measured because the first overlay mark formed on the previous layer in an alignment image is not clear.

To solve these problems, as shown in FIGS. 4 and 5, a method for measuring an overlay error between two layers was used in which a center value C1 of the first overlay mark OM1 is obtained by obtaining a waveform representing changes in intensity for each position of a signal obtained by using the first overlay mark OM1 as a focal plane, and then a central value C2 of the second overlay mark OM2 is obtained by obtaining a waveform representing changes in intensity for each position of a signal obtained by using the second overlay mark OM2 as a focal plane. The problem with this method was that it took two shots each time to measure the overlay error, which lengthened the inspection time.

DOCUMENTS OF RELATED ART (Patent Document 0001) Korean Patent Application Publication No. 10-2003-0054781
(Patent Document 0002) Korean Patent No. 10-0689709
(Patent Document 0003) Korean Patent No. 10-1564312

SUMMARY OF THE INVENTION

Accordingly, one or more embodiments of the present disclosure solve the above problems occurring in the related art, and one or more embodiments of the present disclosure provide an overlay measurement apparatus capable of rapidly and accurately measuring an overlay error between layers with a large height difference.

According to one or more embodiments of the present disclosure, there is provided an overlay measurement apparatus for measuring an error between a first overlay mark and a second overlay mark formed in a pair on different layers of a wafer, the apparatus including: an imaging system configured to acquire alignment images of the first overlay mark and the second overlay mark at a plurality of focus positions; and a controller communicatively coupled to the imaging system.

The imaging system may include: a first light source configured to emit a first illumination light for acquiring the alignment images; a second light source configured to emit a second illumination light; an objective lens configured to condense the first illumination light and the second illumination light into a measurement area of the wafer, and collect first reflected light and second reflected light reflected from the measurement area of the wafer; a first detector configured to collect the first reflected light emitted from the first light source and reflected from the measurement area of the wafer to obtain the aligned images; a second detector configured to acquire a signal varies depending on the focus position from the second reflected light emitted from the second light source and reflected in the measurement area of the wafer; and a first actuator configured to adjust a distance between the measurement area of the wafer and the objective lens to adjust the focus positions.

The controller may include a processor configured to execute instructions stored in a memory of the controller to perform: a) receiving alignment images obtained through the imaging system at a plurality of focus positions in a measurement area; b) determining a position of a measure focus on the basis of a change in a contrast value of the first overlay mark and a change in a contrast value of the second overlay mark of the alignment images; c) obtaining a reference signal value that is a signal value from the second detector at the position of the measure focus; and d) measuring an overlay error based on a measurement image that is an alignment image obtained at the position of the measure focus.

In one or more embodiments, the processor is further configured to execute instructions stored in the memory of the controller to further perform: e) receiving a signal value obtained from the second detector in a measurement area different from the measurement area in the step a); f) comparing the signal value received in the step e) with the reference signal value; g) changing the focus position by controlling the first actuator when the signal value obtained from the second detector is different from the reference signal value; h) receiving an alignment image obtained through the imaging system when the signal value obtained from the second detector matches the reference signal value; and i) measuring an overlay error on the basis of a measurement image, which is the alignment image received in the step h).

In one or more embodiments, the imaging system may further include: an optical lens disposed between the second light source and the objective lens and refracting the second illumination light emitted from the second light source; and a second actuator configured to adjust a position of the optical lens between the second light source and the objective lens, and the processor is further configured to execute instructions stored in the memory of the controller to further perform: comparing, after the step c), the reference signal value with a predetermined reference signal value; and matching the reference signal value with the predetermined reference signal value by controlling the second actuator to adjust the position of the optical lens when the reference signal value and the predetermined reference signal value are different.

The optical lens may be a convex lens.

The second detector may be an autofocus sensor module of a phase difference type, and the predetermined reference signal value may be a value at which a phase difference measured by the autofocus sensor module is minimized.

The step b) may be a step of finding a position of a measure focus between a maximum value in a graph of a contrast value change of the first overlay mark and a maximum value in a graph of a contrast value change of the second overlay mark.

The step b) may be a step of finding a position where the graph of a contrast value change of the first overlay mark and the graph of a contrast value change of the second overlay mark intersect as the position of a measure focus.

In one or more embodiments, the overlay measurement apparatus of the present disclosure may further include: a hot mirror disposed between the second light source and the objective lens, and reflecting long-wavelength light among the second illumination light emitted from the second light source toward the objective lens.

In one or more embodiments, the overlay measurement apparatus of the present disclosure may further include a cylinder lens configured to convert the second illumination light emitted from the second light source into a line beam.

In one or more embodiments, the first light source may be configured to emit the first illumination light in a visible ray region.

In one or more embodiments, the overlay measurement apparatus of the present disclosure may further include a first beam splitter receiving the first illumination light from the first light source, reflecting a part of the first illumination light toward the objective lens.

In one or more embodiments, the second light source may be configured to emit the second illumination light in an infrared region.

In one or more embodiments, the controller may be communicatively coupled to the imaging system wirelessly.

In one or more embodiments, the controller is communicatively coupled to the imaging system using a wire.

As described above, the overlay measurement apparatus of the present disclosure can rapidly and accurately measure an overlay error between layers with a large height difference.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
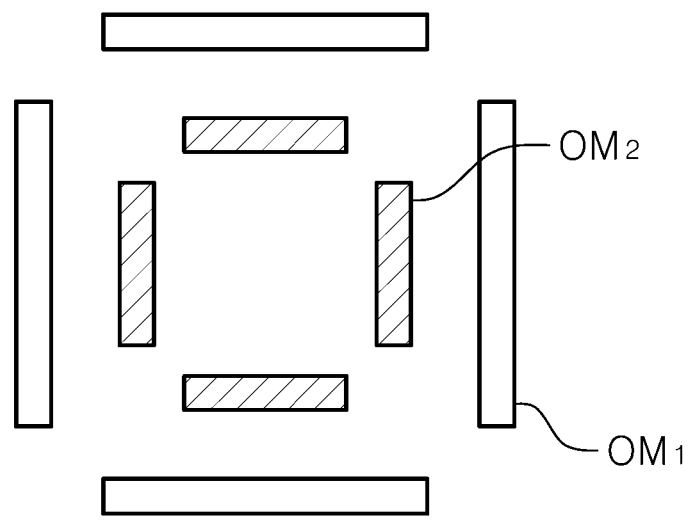
FIG. 1 is a plan view of an overlay mark.

Hereinafter, embodiments of the present disclosure will be described in detail with reference to the accompanying drawings. However, the embodiments of the present disclosure may be modified in many different forms, and the scope of the present disclosure should not be construed as being limited to the embodiments described below. The embodiments of the present disclosure are provided to more completely explain the present disclosure to those skilled in the art. Therefore, the shapes of elements in the drawings are exaggerated for clearer explanation, and elements indicated by the same reference numerals in the drawings mean the same elements.

Figure 6:
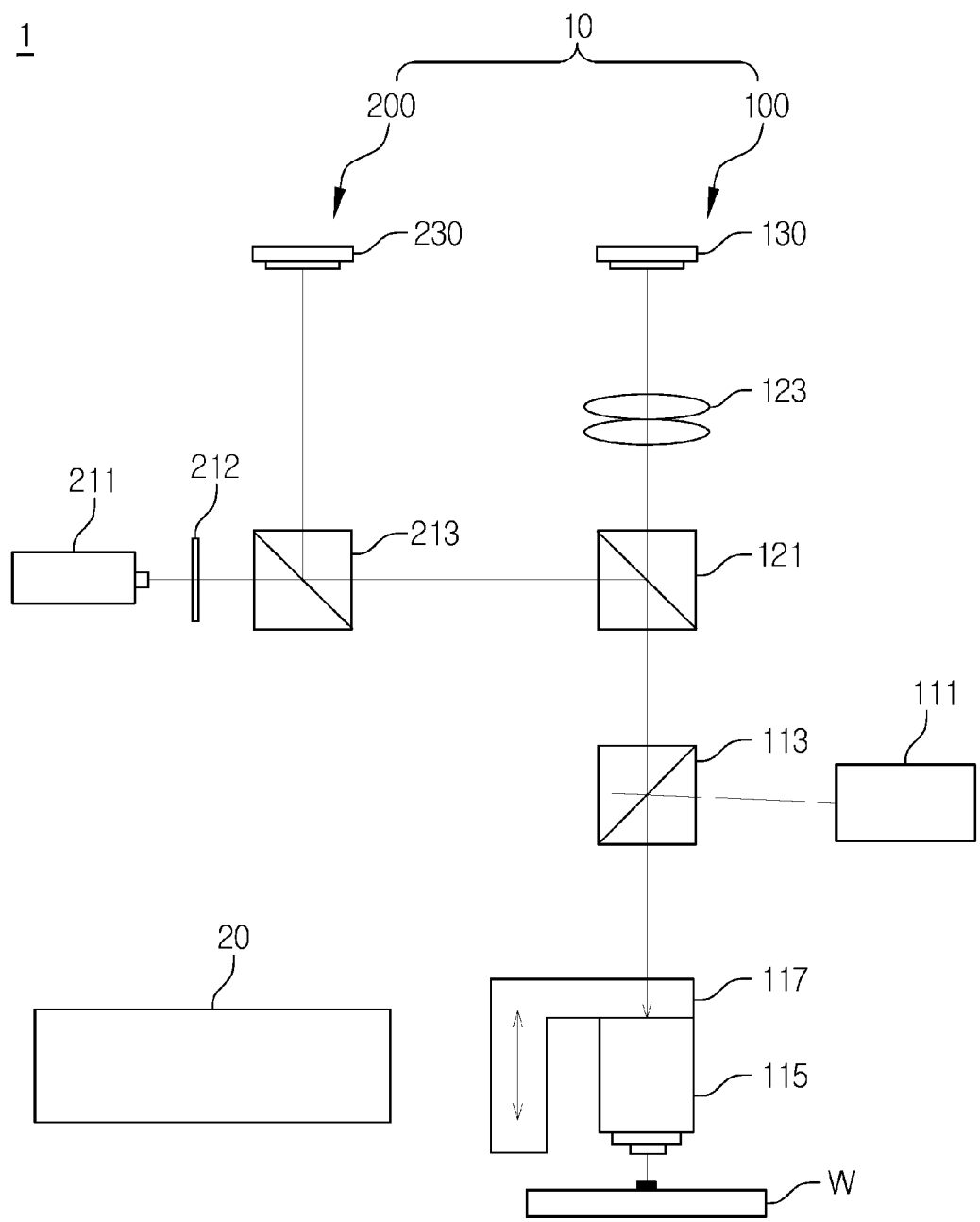
FIG. 6 is a diagram of an overlay measurement apparatus according to an embodiment of the present disclosure.

FIG. 6 is a diagram of an overlay measurement apparatus according to an embodiment of the present disclosure. An overlay measurement apparatus is a device for measuring an error between a first overlay mark and a second overlay mark respectively formed on different layers on a wafer w (semiconductor wafer w).

Figure 2:
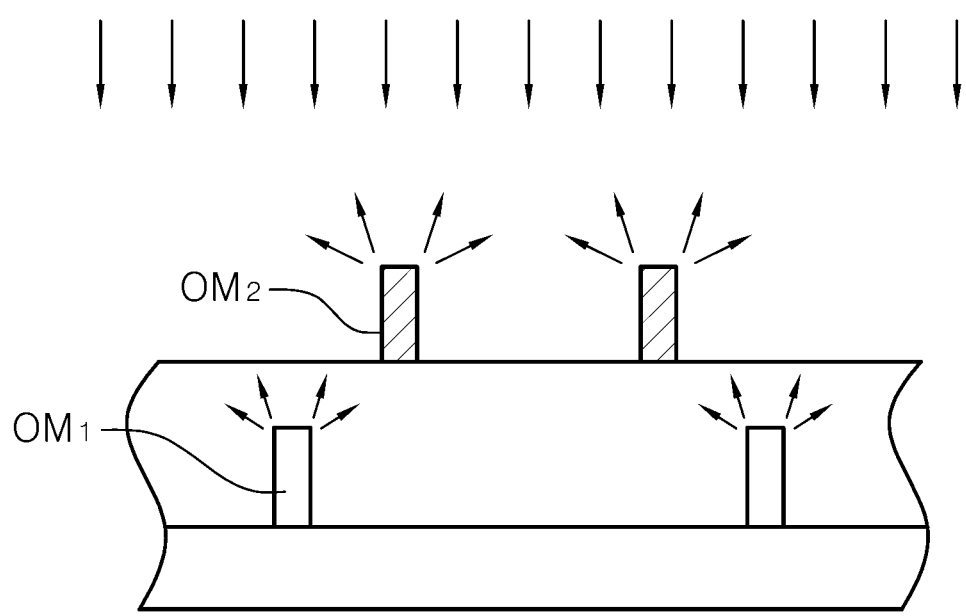
FIG. 2 is a side view of the overlay mark shown in FIG. 1.
Figure 3:
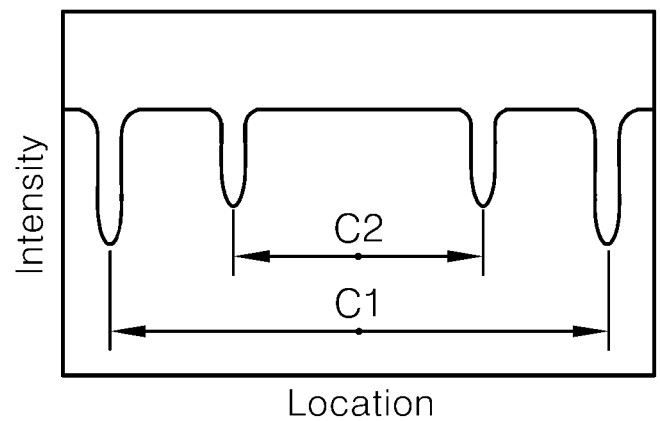
FIG. 3 shows a waveform of changes in intensity for each position of a signal obtained from the first overlay mark image shown in FIG. 1.
Figure 4:
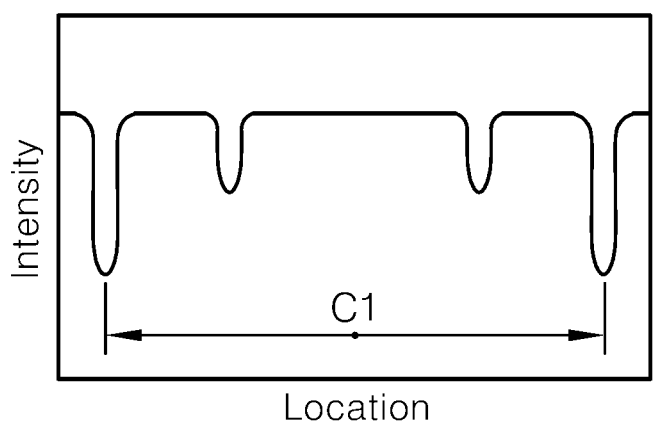
FIG. 4 shows a waveform of changes in intensity for each position of a signal obtained by using the first overlay mark shown in FIG. 1 as a focal plane.
Figure 5:
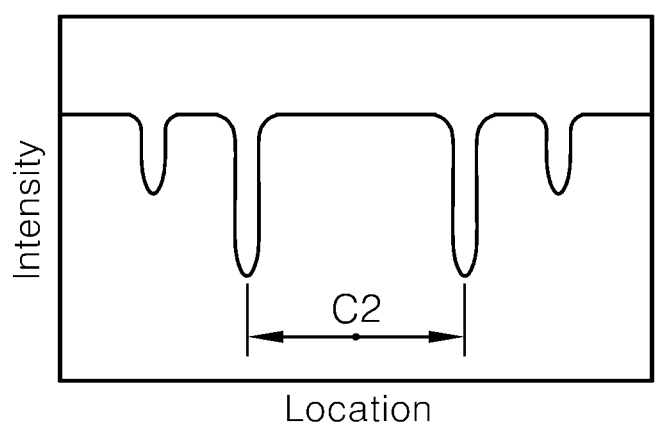
FIG. 5 shows a waveform of changes in intensity for each position of a signal obtained by using the second overlay mark shown in FIG. 1 as a focal plane.

For example, as shown in FIGS. 1 and 2, a first overlay mark OM1 may be an overlay mark formed on a previous layer, and a second overlay mark OM2 may be an overlay mark formed on a current layer. The overlay marks are formed on a scribe lane while constituting layers for forming a semiconductor device in a die region. For example, the first overlay mark OM1 may be formed together with an insulating film pattern, and the second overlay mark OM2 may be formed together with a photoresist pattern formed on the insulating film pattern.

In this case, the second overlay mark OM2 is exposed to the outside, but the first overlay mark OM1 is covered by a photoresist layer. The first overlay mark OM1 is made of an oxide having an optical property different from that of the second overlay mark OM2 made of a photoresist material. In addition, the heights of the first overlay mark OM1 and the second overlay mark OM2 are different from each other.

As the overlay marks, various types of overlay marks that are currently used, such as a box-in-box (BIB) overlay mark (see FIG. 1), an advanced imaging metrology (AIM) overlay mark, and the like, may be used.

As shown in FIG. 6, an overlay measurement apparatus 1 according to an embodiment of the present disclosure includes an imaging system 10 and a controller 20 communicatively coupled to the imaging system 10.

The imaging system 10 largely includes an image acquisition unit 100 and an autofocus unit 200.

The image acquisition unit 100 serves to acquire an image (hereinafter, referred to as an "alignment image") in which the first overlay mark OM1 and the second overlay mark OM2 are displayed together at a plurality of focus positions.

To irradiate a first illumination light to a measurement area of the wafer W, the image acquisition unit 100 includes a first light source 111, a first beam splitter 113, an objective lens 115, and a first actuator 117. The measurement area is an area where the first overlay mark OM1 and the second overlay mark OM2 are formed in the scribe lane of the wafer W. A plurality of measurement areas exist in one wafer W. The overlay measurement apparatus 1 measures overlay errors in the plurality of measurement areas.

A halogen lamp, a xenon lamp, or a light emitting diode may be used as the first light source 111. The first light source 111 generates the first illumination light in a visible ray region.

The first beam splitter 113 reflects a part of the first illumination light emitted from the first light source 111 and guides the reflect light toward the objective lens 115. In addition, the first beam splitter 113 transmits a part of a first reflected light collected by the objective lens 115.

The objective lens 115 condenses the beam reflected from the first beam splitter 113 into the measurement areas of the wafer W and collects the reflected beam in the measurement area. The objective lens 115 is installed on the first actuator 117.

The first actuator 117 adjusts a focus position of the image acquisition unit 100 by adjusting the distance between the objective lens 115 and the wafer W.

The image acquisition unit 100 is provided with a hot mirror 121, a tube lens 123, and a first detector 130 to collect the first reflected light from the measurement areas of the wafer W to obtain an alignment image.

The tube lens 123 collects the first reflected light transmitted through the first beam splitter 113 and the hot mirror 121 to the first detector 130.

The hot mirror 121 reflects ultraviolet rays and transmits visible rays. The hot mirror 121 prevents ultraviolet rays from entering the first detector 130.

The first detector 130 may be a CCD or CMOS camera. The image acquisition unit 100 acquires an alignment image by using an electrical signal from the first detector 130. By analyzing this alignment image, an overlay error may be measured.

The autofocus unit 200 serves to generate a signal based on the distance between the objective lens 115 and the wafer W. That is, the autofocus unit 200 generates a signal according to changes in a focus position of the image acquisition unit 100.

The autofocus unit 200 includes a second light source 211, an optical lens 212 that refracts a second illumination light from the second light source 211, and a second beam splitter 213 to irradiate the second illumination light to the measurement areas of the wafer W. In addition, the autofocus unit 200 uses the hot mirror 121, the first beam splitter 113, and the objective lens 115 of the image acquisition unit 100.

As the second light source 211, a laser diode or a light emitting diode may be used. The second light source 211 generates the second illumination light in an infrared region. The second illumination light is refracted by the optical lens 212, transmitted through the second beam splitter 213, and reflected by the hot mirror 121. A convex lens may be used as the optical lens 212. When a laser is used as the second illumination light, it is preferable to use a polarization beam splitter as the second beam splitter 213. This is because a decrease in the amount of light in the process of reflection and transmission may be minimized.

The second illumination light reflected from the hot mirror 121 passes through the first beam splitter 113 and then enters the objective lens 115. The objective lens 115 condenses the second illumination light into the measurement areas of the wafer W and collects a second reflected light reflected from the measurement areas. The present disclosure has the advantage of using one objective lens 115 to condense the first illumination light and the second illumination light and to collect the first reflected light and the second reflected light.

In the present disclosure, infrared rays having a different wavelength band from the first illumination light is used as the second illumination light, and the second reflected light and the first reflected light are separated using the hot mirror 121 to prevent the second reflected light from entering the first detector 130.

The second reflected light collected by the objective lens 115 is again transmitted through the first beam splitter 113 and then reflected by the hot mirror 121. Since infrared rays cannot pass through the hot mirror 121, the second reflected light in the infrared region does not enter the first detector 130.

The second reflected light reflected by the hot mirror 121 is reflected from the second beam splitter 213 toward the second detector 230.

As the second detector 230, a high-speed conventional autofocus sensor module of a phase difference type may be used. For example, a phase-difference type autofocus sensor module including a beam splitter, a micro lens, and a pair of photodiodes may be used. The second detector 230 generates a signal based on the distance between the objective lens 115 and the wafer W. For example, when the focus of the image acquisition unit coincides with "standard focus", the phase difference value, which is the signal value output to the second detector 230, may be zero (0). When the focus of the image acquisition unit does not match the standard focus, the value may be a + or − value depending on the focus position. The standard focus is the focus of the image acquisition unit determined based on the signal of the second detector 230. Although the standard focus may coincide with "measure focus" suitable for acquiring an actual aligned image, when the height difference between the first overlay mark OM1 and the second overlay mark OM2 is large, the standard focus and measure focus are mostly different from each other. The measurement method of the measure focus will be described later.

The controller 20 is communicatively coupled to the imaging system 10 by wire or wirelessly. The controller 20 includes hardware such as a processor and memory, and software installed (stored) in the memory. The software includes executable instructions. The processor may include one or more processors and the memory may include one or more memories. The one or more memories are one or more non-transitory computer readable media. Accordingly, software including executable instructions may be stored in one or more non-transitory computer readable media. The controller 20 instructs the processor to perform the steps of FIG. 7 through executable software instructions stored in one or more non-transitory computer readable media.

Figure 7:
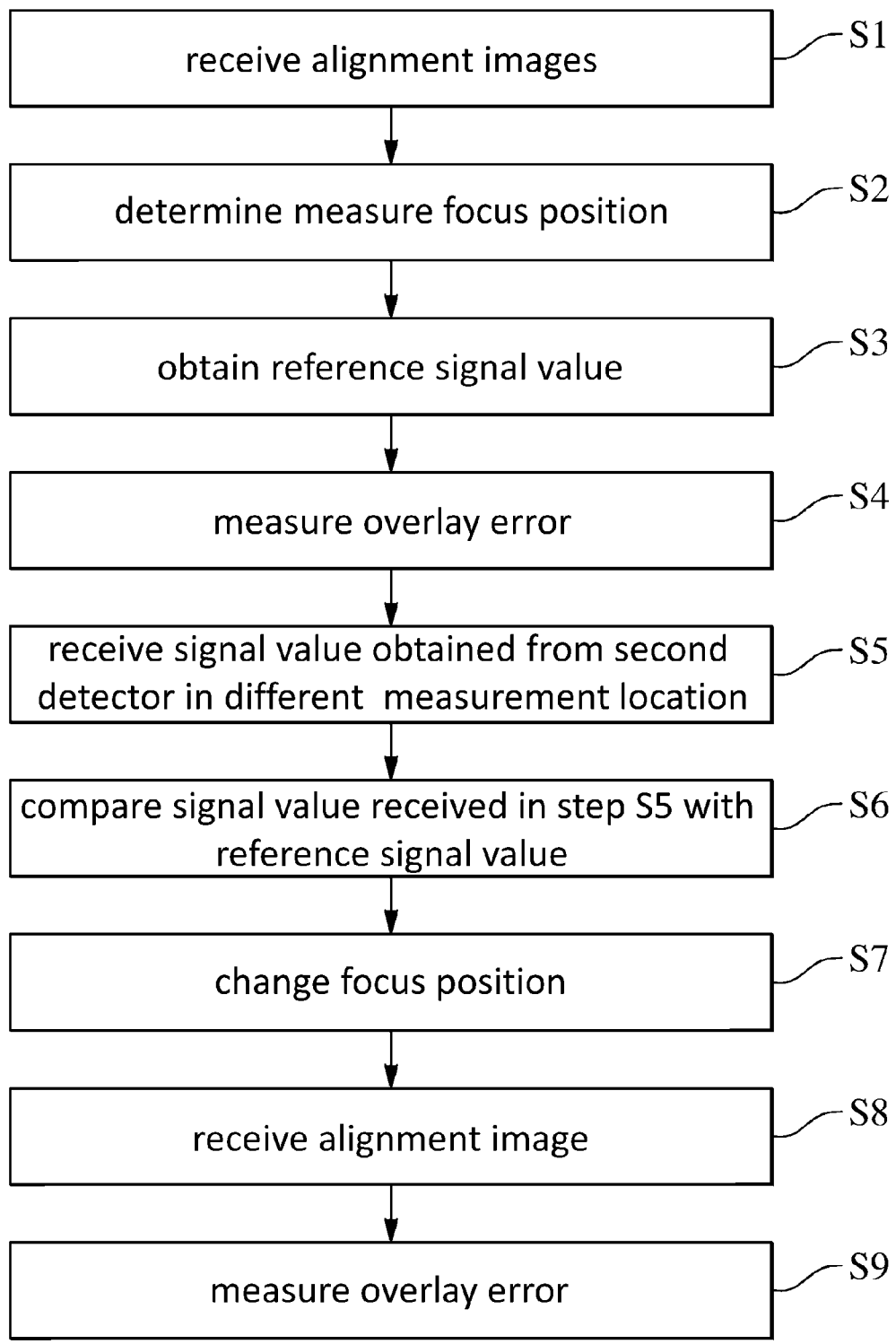
FIG. 7 is a flowchart showing operations of the overlay measurement apparatus shown in FIG. 6.

FIG. 7 is a flowchart showing the operation of the overlay measurement apparatus shown in FIG. 6. The terms "step(s)" and "operation(s)" may be used interchangeably. First, the step (S1) of receiving alignment images is described.

In this step, the controller 20 receives alignment images obtained through the imaging system 10 at a plurality of focus positions. The alignment images include the first overlay mark OM1 and the second overlay mark OM2. The alignment images may be acquired while continuously changing the focus position using the first actuator 117.

Next, the step (S2) of determining the position of the measure focus (MF) will be described. The measure focus position is a focus position used when obtaining a measurement image, which is an alignment image used for overlay error measurement, among a plurality of alignment images. In other words, the measure focus position is an optimized focus position for measuring an overlay error.

The controller 20 may determine the measure focus position on the basis of the change in a contrast value of the first overlay mark OM1 and the change in a contrast value of the second overlay mark OM2 of the alignment images according to a focus position.

Figure 8:
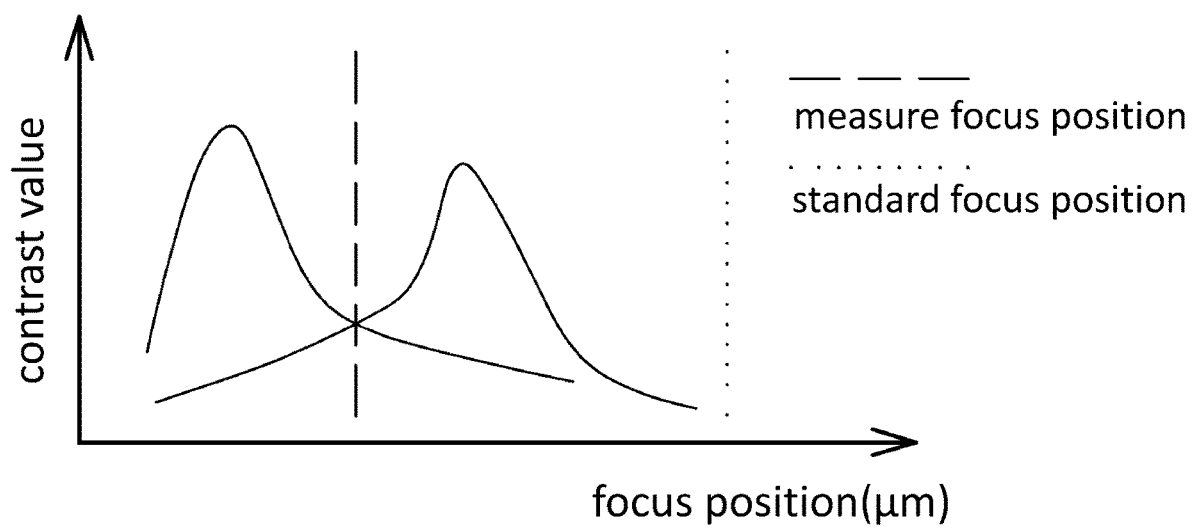
FIG. 8 is a view showing an operation of finding a measure focus position in FIG. 7.

As shown in FIG. 8, the contrast value of the first overlay mark OM1 and the contrast value of the second overlay mark OM2 change depending on the focus position (distance between the objective lens and the wafer). The contrast value of the first overlay mark OM1 is maximized at the focus position where the distance between the wafer W and the objective lens 115 is short since the first overlay mark OM1 is located on the previous layer formed first. On the contrary, the contrast value of the second overlay mark OM2 is maximized at the focus position where the distance between the wafer W and the objective lens 115 is far since the second overlay mark OM2 is located on the current layer formed on the previous layer.

The measure focus position may be found, for example, at a position between the maximum value in a graph of the contrast value change of the first overlay mark OM1 and the maximum value in a graph of the contrast value change of the second overlay mark OM2. For example, the position where the graph of the contrast value change of the first overlay mark OM1 and the graph of the contrast value change of the second overlay mark OM2 intersect may be set as the measure focus position. Alternatively, the average value of the maximum value in the graph of the contrast value change of the first overlay mark OM1 and the maximum value in the graph of the contrast value change of the second overlay mark OM2 may be set as the measure focus position.

In some cases, the measure focus position may be located outside the range between the maximum value in the graph of the contrast value change of the first overlay mark OM1 and the maximum value in the graph of the contrast value change of the second overlay mark OM2.

Next, the step (S3) of obtaining a reference signal value will be described.

Figure 9:
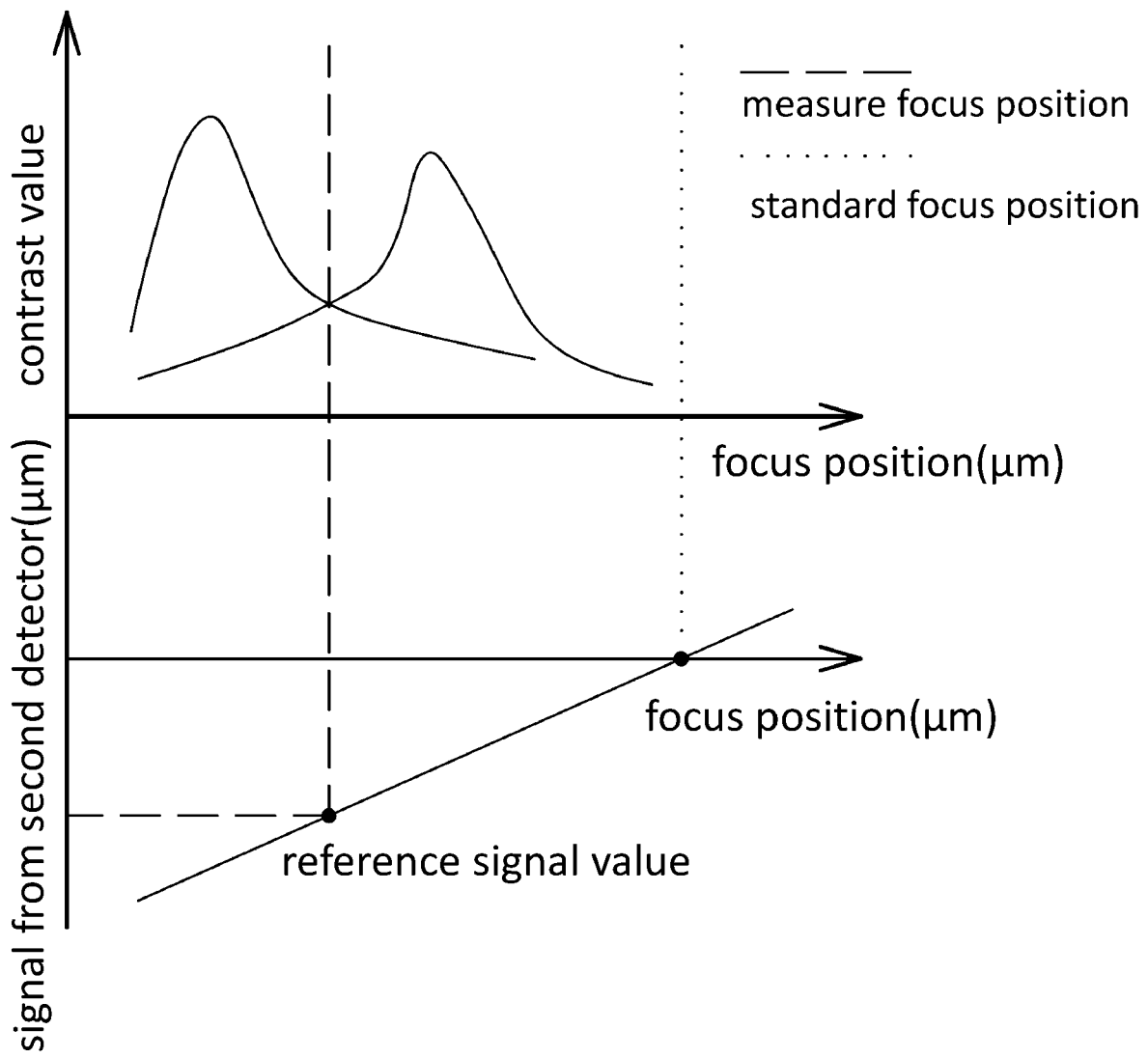
FIG. 9 is a diagram showing an operation of finding a reference signal value of FIG. 7.

As shown in FIG. 9, in this step, the controller 20 obtains a reference signal value, which is a signal value from the second detector 230 at the measure focus position. When the measure focus position coincides with a standard focus position, the phase value, which is the signal value from the second detector 230, may be zero (0). When the measure focus position does not match the standard focus position, the phase value will have a specific value and this value becomes the reference signal value.

Next, the step (S4) of measuring an overlay error will be described.

In this step (S4), the overlay error is measured based on a measurement image, which is an alignment image obtained at the measure focus position. Since the method of measuring an overlay error using a measurement image is a conventional technique, a detailed description thereof will be omitted.

Next, the step (S5) of receiving a signal value obtained from the second detector in the other measurement area will be described.

Pairs of first and second overlay marks OM1 and OM2 are formed in a plurality of measurement areas on a single wafer. Thus, the overlay measurement apparatus according the present disclosure measures overlay errors in the plurality of measurement areas. An advantage of the overlay measurement apparatus according to the present disclosure is that the measurement speed is fast, particularly when measuring overlay errors in a plurality of measurement areas.

In this step (S5), the controller 20 receives a signal value obtained from the second detector 230 in a measurement area different from the first measurement area in which the reference signal value was acquired.

Next, the step (S6) of comparing the signal value received in step S5 with the reference signal value will be described.

In this step (S6), the controller 20 compares the signal value received in step S5 with the reference signal value. Ideally, the signal value received in step S5 and the reference signal value match, but the received signal value and the reference signal value may be different from each other since there is a deviation for each position of the wafer W.

Next, the step (S7) of changing the focus position will be described.

In this step (S7), the controller 20 changes the focus position by controlling the first actuator so that the signal value obtained from the second detector 230 coincides with the reference signal value. In this step (S7), considering the deviation according to the position of the wafer W, the focus position in the current measurement area different from the initial measurement area is changed to the measure focus position.

As such, in the present disclosure, by finding the measure focus position based on the contrast value change of alignment images only once in the first measurement area, the measure focus position may be quickly found in other measurement areas using the signal value from the second detector 230.

Next, the step (S8) of receiving an alignment image will be described.

In this step (S8), the controller 20 controls the imaging system 10 to obtain an aligned image, and receives the acquired alignment image.

Next, the step (S9) of measuring an overlay error based on a measurement image, which is an alignment image received in step S8, will be described. As in step (S8), in this step (S9), the overlay error is measured based on the measurement image.

The above-described steps S5 to S8 are repeatedly performed for each measurement area.

In the first measurement area, a plurality of alignment images are obtained according to a focus position, and on the basis of the change in the contrast value of the first overlay mark OM1 and the change in the contrast value of the second overlay mark OM2 of the plurality of alignment images, the measure focus position is determined. Therefore, it takes a long time to measure an overlay error.

However, in measurement areas other than the first measurement area, by comparing the signal value obtained from the second detector 230 with the reference signal value and controlling the first actuator 117 to quickly move to the measure focus position, the overlay error may be quickly measured.

Figure 10:
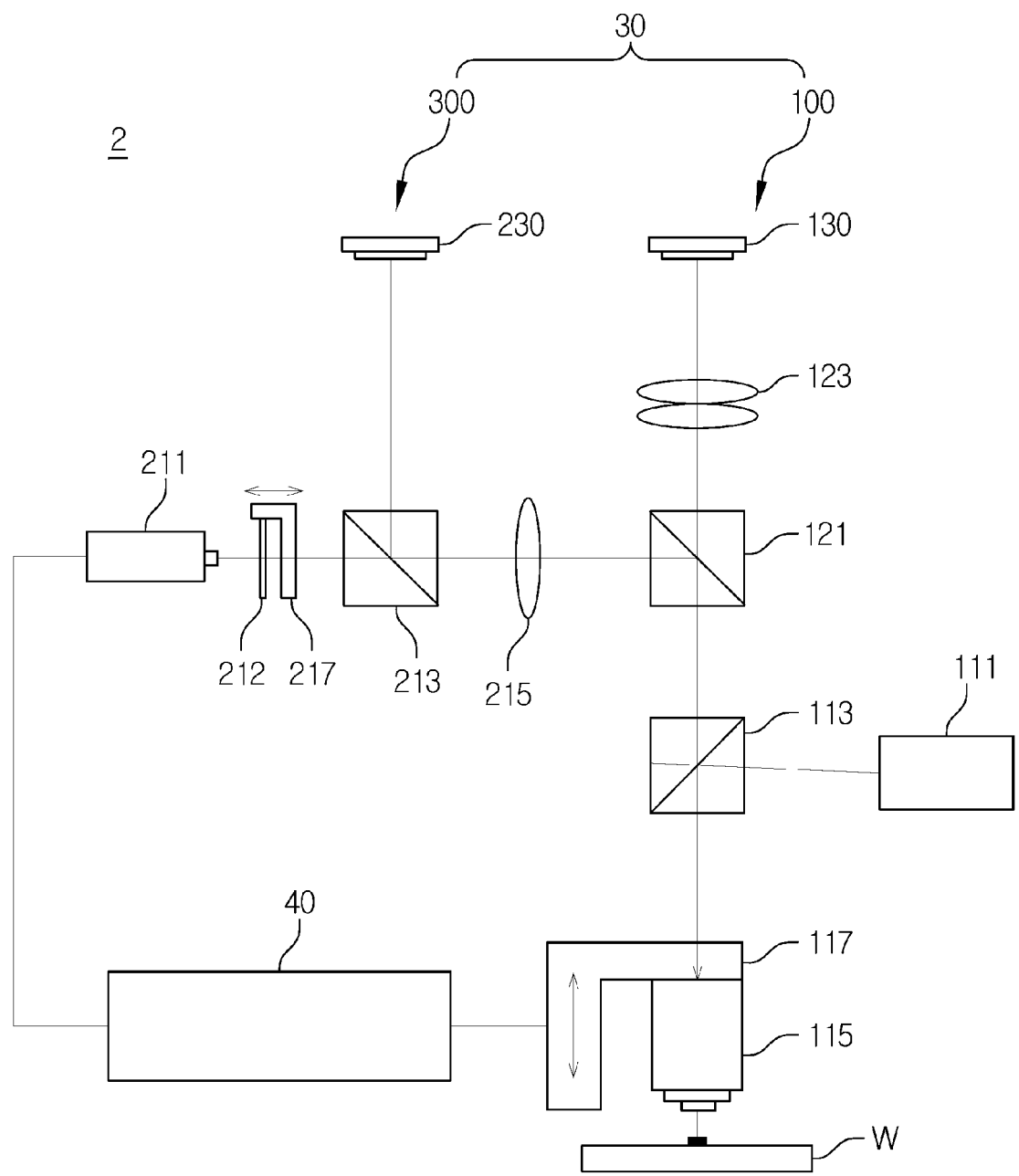
FIG. 10 is a diagram of an overlay measurement apparatus according to another embodiment of the present disclosure.

FIG. 10 is a diagram of an overlay measurement apparatus according to another embodiment of the present disclosure.

An imaging system 30 of an overlay measurement apparatus 2 shown in FIG. 10 differs from the imaging system 10 of the embodiment shown in FIG. 6 only in that an autofocus unit 300 further includes a second actuator 217 and a cylinder lens 215.

Figure 11:
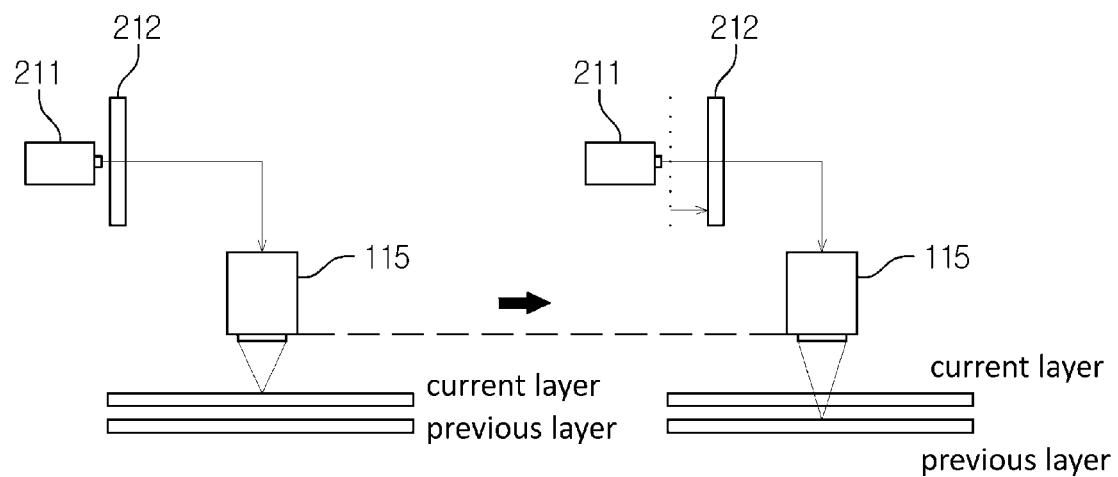
FIG. 11 is a view showing a change in a focus position according to a position of an optical lens.
Figure 12:
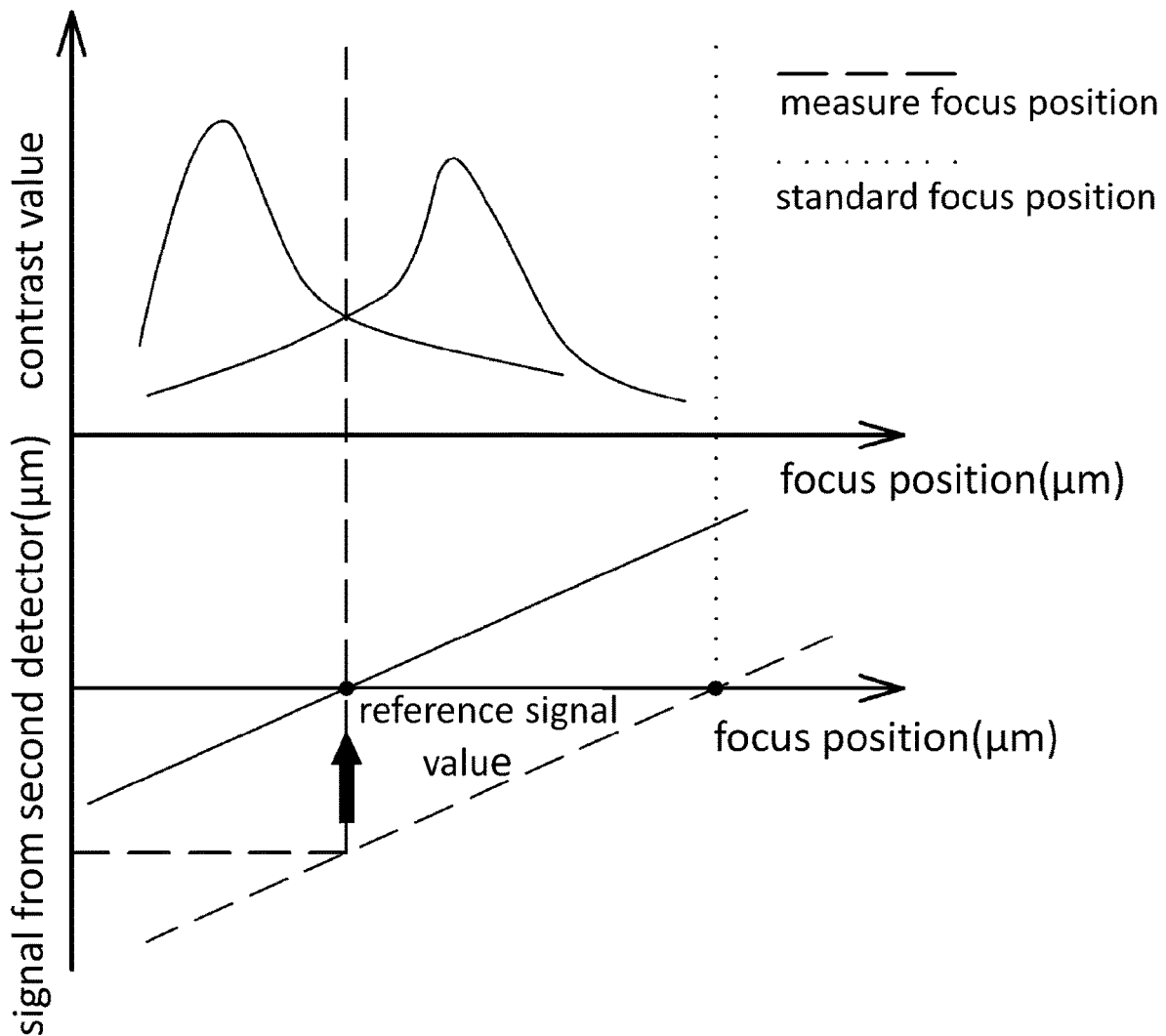
FIG. 12 is a view showing a change in a reference signal value according to a position of an optical lens.

The second actuator 217 adjusts the position of an optical lens 212 between a second light source 211 and an objective lens 115. As shown in FIG. 11, when the position of the optical lens 212 is adjusted, the focus position of the autofocus unit 300 is changed. Accordingly, the signal value obtained from a second detector 230 also changes, and accordingly, the reference signal value also changes as shown in FIG. 12.

The cylinder lens 215 is disposed between the optical lens 212 and the objective lens 115. As the cylinder lens 215, cylinder lenses 215 having various shapes such as a rectangle, a square, a circle, and an ellipse may be used. The cylinder lens 215 is a lens that focuses light on a line rather than a point. The cylinder lens 215 serves to form a line beam. The advantage of using a line beam is that sensitivity is increased due to optical aberrations, enabling more precise measurements.

A controller 40 is communicatively coupled to the imaging system 30 by wire or wirelessly. The controller 40 includes hardware such as a processor and memory, and software installed (stored) in the memory. The software includes executable instructions. The processor may include one or more processors and the memory may include one or more memories. The one or more memories are one or more non-transitory computer readable media. Accordingly, software including executable instructions may be stored in one or more non-transitory computer readable media. The controller 40 instructs the processor to perform the steps of FIGS. 7 and 13 through executable software instructions stored in one or more non-transitory computer readable media.

Figure 13:
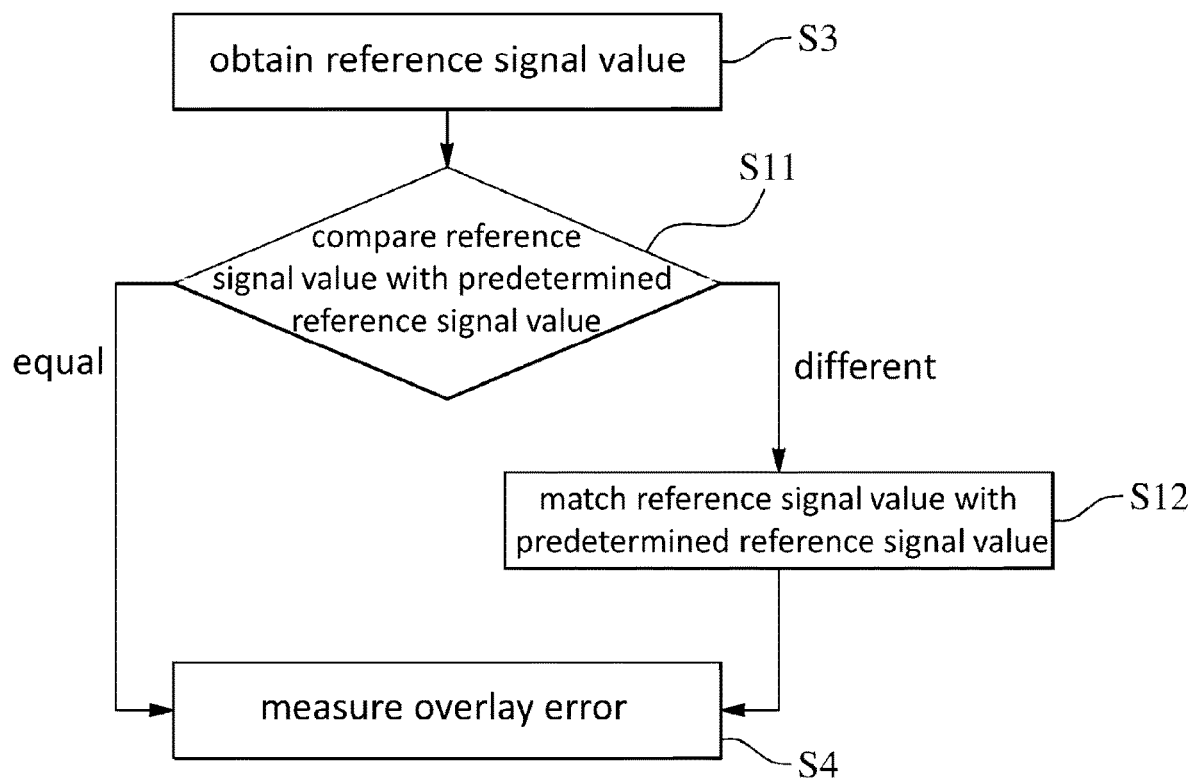
FIG. 13 is a partial flowchart showing operations of the overlay measurement apparatus shown in FIG. 10.

The operation of a controller 40 is different from the operation of the controller of the overlay measurement apparatus shown in FIG. 7 in that the processor additionally performs the following steps shown in FIG. 13 between steps S3 and S5. As indicated above, the terms "step(s)" and "operation(s)" may be used interchangeably.

First, among the additionally performed steps, the step (S11) of comparing the reference signal value with a predetermined reference signal value will be described. In this step (S11), the reference signal value acquired in step S3 is compared with a predetermined reference signal value. For example, the reference signal value output from a second detector 230 may be a phase difference value, and a predetermined reference signal value may be zero (0).

If the reference signal value is equal to the predetermined reference signal value, step (S4) is performed. If step (S11) proceeds after step (S4), step (S5) is performed. In FIG. 13, step (S11) is performed between steps (S3) and (S4).

If the reference signal value and the predetermined reference signal value are different, by controlling the second actuator 217 to adjust the position of the optical lens 212, the step (S12) of matching the reference signal value with the predetermined reference signal value is further performed. That is, in this step, when the focus position of an image acquisition unit 100 is adjusted to the measure focus position, the position of the optical lens 212 is adjusted so that the reference signal value of the second detector 230 coincides with the predetermined reference signal value. The predetermined reference signal value becomes a signal value belonging to the section in which the accuracy of the second detector 230 is highest. For example, if the second detector 230 is a phase difference type autofocus sensor module, the reference signal value becomes zero (0) or a value adjacent to zero (0). The phase-difference type autofocus sensor module has low accuracy in the phase difference section. Thus, this embodiment is advantageous compared to the embodiments of FIGS. 6 and 7 in that an error may occur if the focus position of the image acquisition unit 100 is adjusted to the measure focus position on the basis of the signal value of the second detector 230 in a section where the phase difference is large.

The predetermined reference signal value may be a specific value, but an arbitrary value within a certain range may be set as the reference signal value. For example, when a reference signal value falls within the range of 0±α where the accuracy of the second detector 230 is ensured, the value may be used as the reference signal value and the position of the optical lens may not be adjusted.

After step (S12), step (S4) (or step S5) is performed. Subsequent steps are the same as those shown in FIG. 7.

The embodiments described above are only exemplary embodiments of the present disclosure, and the scope of the present disclosure is not limited to the described embodiments. It should be understood that various changes, modifications, or substitutions may be made by those skilled in the art within the technical spirit and claims of the present disclosure, and such changes, modifications, or substitutions fall within the scope of the present disclosure.

What is claimed is:

1. An overlay measurement apparatus for measuring an error between a first overlay mark and a second overlay mark formed in a pair on different layers of a wafer, the apparatus comprising:
   an imaging system configured to acquire alignment images of the first overlay mark and the second overlay mark at a plurality of focus positions; and
   a controller communicatively coupled to the imaging system,
   wherein the imaging system comprises:
   a first light source configured to emit a first illumination light for acquiring the alignment images;
   a second light source configured to emit a second illumination light;
   an objective lens configured to condense the first illumination light and the second illumination light into a measurement area of the wafer, and collect first reflected light and second reflected light reflected from the measurement area of the wafer;
   a first detector configured to collect the first reflected light emitted from the first light source and reflected from the measurement area of the wafer to obtain the alignment images;
   a second detector configured to acquire a signal that varies depending on the focus position from the second reflected light emitted from the second light source and reflected in the measurement area of the wafer; and
   a first actuator configured to adjust a distance between the measurement area of the wafer and the objective lens to adjust the focus positions, and
   wherein the controller comprises a processor configured to execute instructions stored in a memory of the controller
   to perform:
   a) receiving alignment images obtained through the imaging system at a plurality of focus positions in a measurement area;
   b) determining a position of a measure focus on the basis of a change in a contrast value of the first overlay mark and a change in a contrast value of the second overlay mark of the alignment images;
   c) obtaining a reference signal value that is a signal value from the second detector at the position of the measure focus; and
   d) measuring an overlay error based on a measurement image that is an alignment image obtained at the position of the measure focus.

2. The apparatus of claim 1, wherein the processor is further configured to execute instructions stored in the memory of the controller to further perform:
   e) receiving a signal value obtained from the second detector in a measurement area different from the measurement area in the step a);
   f) comparing the signal value received in the step e) with the reference signal value;
   g) changing the focus position by controlling the first actuator when the signal value obtained from the second detector is different from the reference signal value;
   h) receiving an alignment image obtained through the imaging system when the signal value obtained from the second detector matches the reference signal value; and
   i) measuring an overlay error on the basis of a measurement image, which is the alignment image received in the step h).

3. The apparatus of claim 1, wherein the imaging system further comprises:
   an optical lens disposed between the second light source and the objective lens and refracting the second illumination light emitted from the second light source; and
   a second actuator configured to adjust a position of the optical lens between the second light source and the objective lens, and
   wherein the processor is further configured to execute instructions stored in the memory of the controller to further perform:
   comparing, after the step c), the reference signal value with a predetermined reference signal value; and
   matching the reference signal value with the predetermined reference signal value by controlling the second actuator to adjust the position of the optical lens when the reference signal value and the predetermined reference signal value are different.

4. The apparatus of claim 3, wherein the optical lens is a convex lens.

5. The apparatus of claim 3, wherein the second detector is an autofocus sensor module of a phase difference type, and the predetermined reference signal value is a value at which a phase difference measured by the autofocus sensor module is minimized.

6. The apparatus of claim 1, wherein the step b) is a step of finding a position of a measure focus between a maximum value in a graph of a contrast value change of the first overlay mark and a maximum value in a graph of a contrast value change of the second overlay mark.

7. The apparatus of claim 6, wherein the step b) is a step of finding a position where the graph of a contrast value change of the first overlay mark and the graph of a contrast value change of the second overlay mark intersect as the position of a measure focus.

8. The apparatus of claim 1, further comprising:
   a hot mirror disposed between the second light source and the objective lens, and reflecting long-wavelength light among the second illumination light emitted from the second light source toward the objective lens.

9. The apparatus of claim 1, further comprising:
   a cylinder lens configured to convert the second illumination light emitted from the second light source into a line beam.

10. The apparatus of claim 1, wherein the first light source is configured to emit the first illumination light in a visible ray region.

11. The apparatus of claim 1, further comprising a first beam splitter receiving the first illumination light from the first light source, reflecting a part of the first illumination light toward the objective lens.

12. The apparatus of claim 1, wherein the second light source is configured to emit the second illumination light in an infrared region.

13. The apparatus of claim 1, wherein the controller is communicatively coupled to the imaging system wirelessly.

14. The apparatus of claim 1, wherein the controller is communicatively coupled to the imaging system using a wire.

\* \* \* \* \*